US010809621B2

(12) United States Patent
Charbonnier et al.

(10) Patent No.: US 10,809,621 B2
(45) Date of Patent: Oct. 20, 2020

(54) PROCESS FOR THE EXPOSURE OF A REGION ON ONE FACE OF AN ELECTRONIC DEVICE

(71) Applicant: COMMISSARIAT À L'ÉNERGIE ATOMIQUE ET AUX ÉNERGIES ALTERNATIVES, Paris (FR)

(72) Inventors: Jean Charbonnier, Grenoble (FR); Jean-Louis Pornin, Crolles (FR); Olivier Castany, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 13 days.

(21) Appl. No.: 16/226,009

(22) Filed: Dec. 19, 2018

(65) Prior Publication Data
US 2019/0196333 A1 Jun. 27, 2019

(30) Foreign Application Priority Data

Dec. 21, 2017 (FR) ...................................... 17 62887
Dec. 21, 2017 (FR) ...................................... 17 62888

(51) Int. Cl.
G03F 7/20 (2006.01)
B81B 7/00 (2006.01)
(Continued)

(52) U.S. Cl.
CPC .......... *G03F 7/2022* (2013.01); *B81B 7/0032* (2013.01); *B81B 7/02* (2013.01);
(Continued)

(58) Field of Classification Search
CPC ................... C07D 405/14; C07K 16/18; B81B 2203/0315; B81B 7/0032; B81B 7/02;
(Continued)

(56) References Cited

U.S. PATENT DOCUMENTS 10,061,057 B2 * 8/2018 Wong ....................... G01V 8/12
2003/0152336 A1 8/2003 Gurevich et al.
(Continued)

FOREIGN PATENT DOCUMENTS

EP 2762937 A1 8/2014

OTHER PUBLICATIONS

Search Report for FR 1762888 dated Jul. 6, 2018.
Search Report for FR 1762887 dated Aug. 28, 2018.

*Primary Examiner* — Lan Vinh
(74) *Attorney, Agent, or Firm* — Pearne & Gordon LLP

(57) ABSTRACT

A process for exposing at least one region of a face, known as the front face, of an electronic device, the process including the following steps: A bonding step for a cover (600) to the front face, the bonding being undertaken such that the cover (600) forms a closed cavity (650) with the region, advantageously hermetically sealed; Formation of an encapsulation coating (700), of thickness E1, covering the front face and the cover (600); A thinning step for the encapsulation coating (700), the thinning step including removal of a removal thickness E2, less than the thickness E1, of the encapsulation coating (700), the removal thickness E2 being adjusted such that an opening is formed in the cover (600).

19 Claims, 8 Drawing Sheets

(51) Int. Cl.
*B81B 7/02* (2006.01)
*B81C 1/00* (2006.01)
*G02B 6/42* (2006.01)

(52) U.S. Cl.
CPC ........ *B81C 1/0023* (2013.01); *B81C 1/00833* (2013.01); *G02B 6/423* (2013.01); *G02B 6/428* (2013.01); *G02B 6/4214* (2013.01); *B81B 2203/0315* (2013.01)

(58) Field of Classification Search
CPC . B81C 1/0023; B81C 1/00833; G02B 6/4214; G02B 6/423; G02B 6/428; G03F 7/2022; A61K 2300/00; A61K 31/4709; A61K 31/573; A61K 31/661; A61K 31/704; A61K 31/708; A61K 39/395; A61K 2039/54; A61K 2039/542; A61K 2039/545; A61K 2039/55; A61K 45/06; A61P 1/04; A61P 35/00; A61P 35/02; A61P 35/04

USPC .............. 216/33, 34, 35, 36, 38, 40; 257/52, 257/53.635, 636; 438/694, 695, 703
See application file for complete search history.

(56) References Cited

U.S. PATENT DOCUMENTS

| | | | |
|---|---|---|---|
| 2007/0047113 A1* | 3/2007 | Davis | G02B 26/0841 359/849 |
| 2008/0112037 A1* | 5/2008 | Pan | B81C 1/00293 359/291 |
| 2013/0193529 A1* | 8/2013 | Burchard | B81C 1/00158 257/415 |
| 2013/0200528 A1* | 8/2013 | Lin | H01L 21/561 257/774 |
| 2013/0259423 A1 | 10/2013 | Charbonneau-Lefort | |
| 2013/0266262 A1 | 10/2013 | Nishimura et al. | |
| 2014/0199019 A1 | 7/2014 | Yabre | |
| 2014/0203380 A1 | 7/2014 | Theuss | |
| 2017/0057809 A1 | 3/2017 | Saint-Patrice et al. | |
| 2017/0205593 A1 | 7/2017 | Son et al. | |
| 2019/0006221 A1 | 1/2019 | Charbonnier et al. | |

* cited by examiner

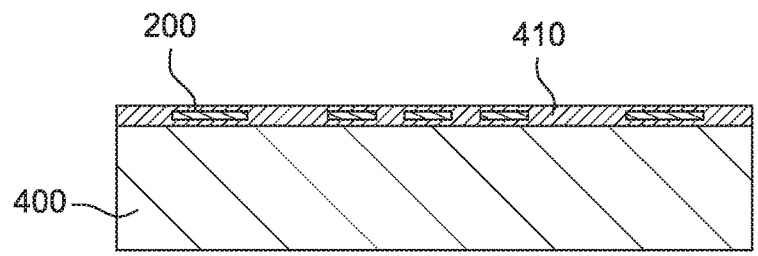
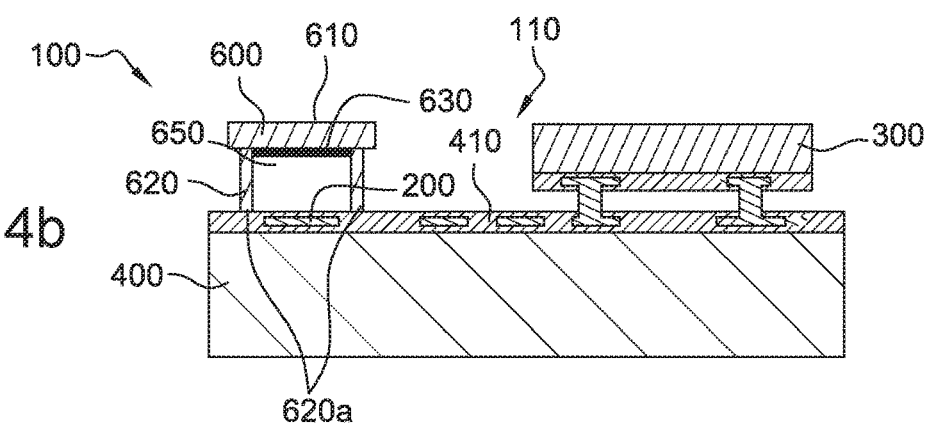
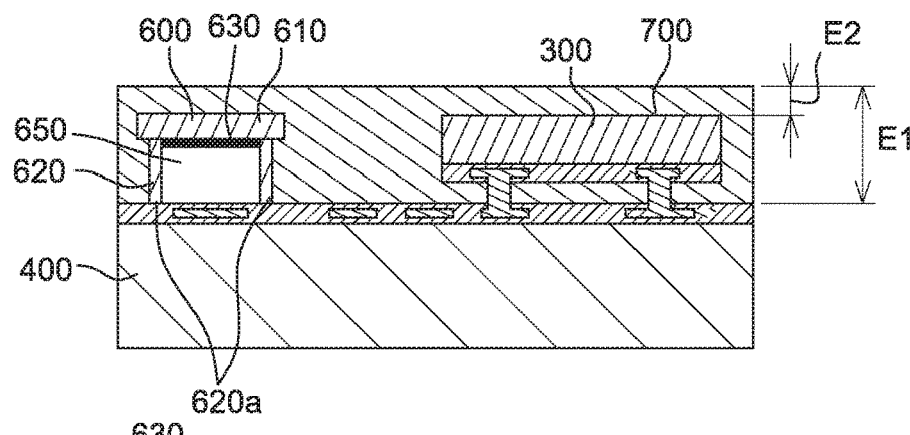
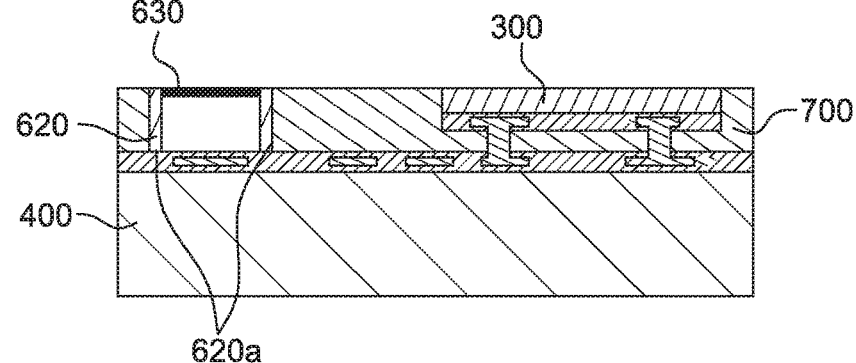
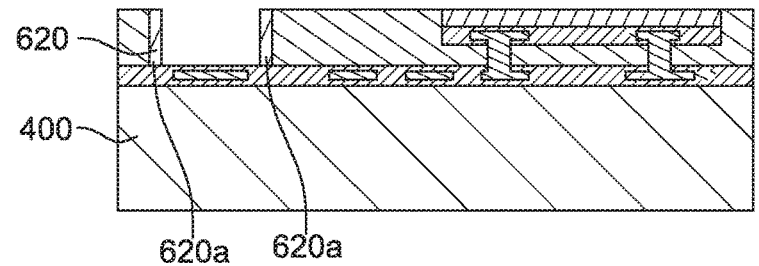

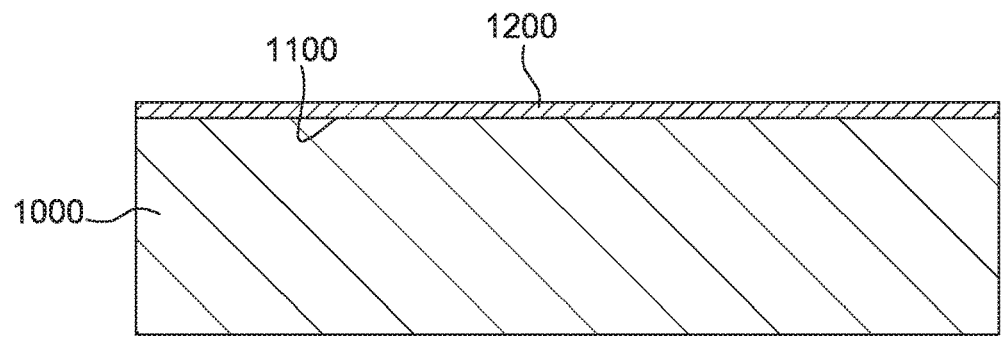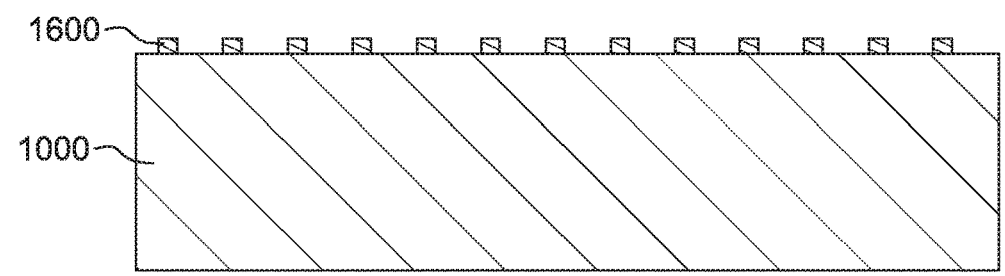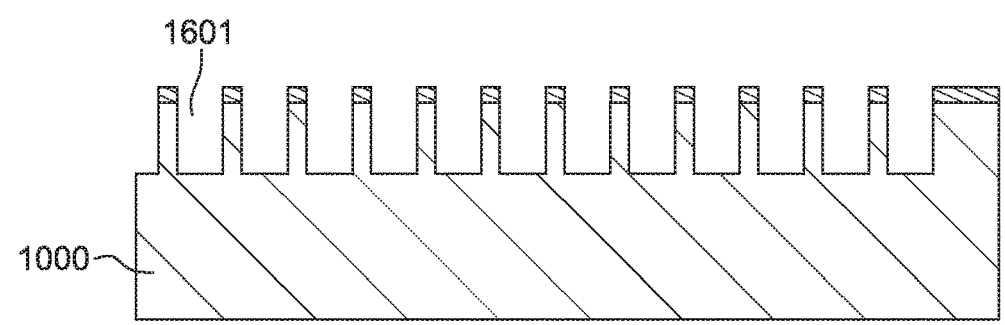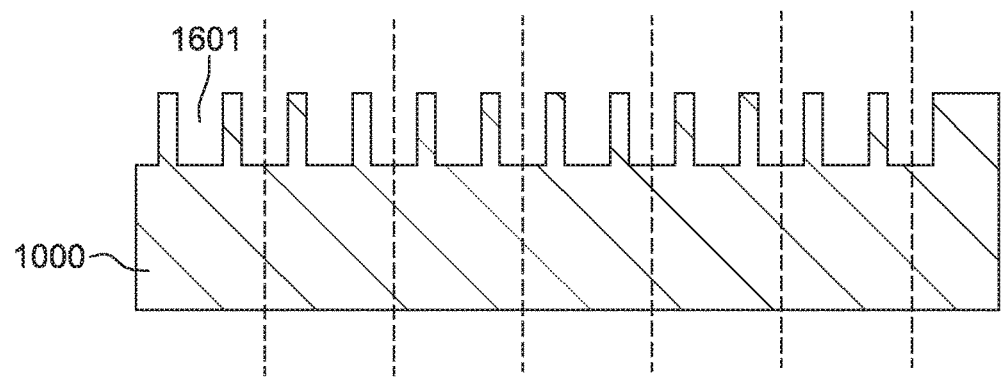
FIG.8

PROCESS FOR THE EXPOSURE OF A REGION ON ONE FACE OF AN ELECTRONIC DEVICE

CROSS-REFERENCE TO RELATED APPLICATIONS

This application claims priority from French Patent Application No. 1762887 and French Patent Application No. 1762888 both filed on Dec. 21, 2017. The content of both applications are incorporated herein by reference in their entirety.

TECHNICAL DOMAIN

The present invention concerns a process for the exposure of a region of an electronic device. In particular, the present invention concerns a process for the exposure of a region, without any deep etching.

The present invention also concerns an exposure process for the manufacture of coupling and alignment structures enabling the alignment and coupling of optical fibres on a device, such as an optoelectronic device. In particular, coupling and alignment structures are laid out such as to enable coupling of the light from at least one optical fibre in the optoelectonic device. Notably, the optical fibres are retained in a ferrule which features alignment structures intended to correspond with the complementary alignment structures present on the optoelectonic device. The structures manufactured on the optoelectonic device also include openings which act as a passageway for the light. In a particular manufactured version, the ferrule also includes optical devices for shaping the beam, intended to correspond with other beam shaping optical devices located on the optoelectonic device within the light passageways and associated with the optoelectonic device coupling elements.

PREVIOUS STATE OF THE ART

The final manufacturing steps of electronic devices may involve transferring one or more electronic structures 3 to the main face 4a of a support structure 4 ensuring, for example, the mechanical cohesion of the assembly and/or the electrical connectivity between the different structures liable to be transferred to the said face.

Also, in order to protect the final assembly from the environmental conditions to which it is exposed, the transfer of electronic structures 3 is followed by an encapsulation step which consists of the formation of an encapsulation coating 2 covering the main face 4a and the electronic structure(s) 3.

The encapsulation coating 2 may be formed by a moulding process and/or rolling at the device level or, for economical reasons, at the level of the substrate including a number of support structures on which the electronic structures 3 are transferred.

FIG. 1 shows, in particular, an electronic device 1, which includes an electronic structure 3 transferred to a support structure 4, and featuring an encapsulation coating 2 covering the electronic structure 3 and the main face 4a of the support structure 4.

Equivalently, the electronic device 1 may include a number of electronic structures 3 connected together either directly or via the support structure 4. For example, as illustrated in FIG. 2, the electronic device 1 may include two electronic structures 3, known respectively as the first electronic structure 3 and second electronic structure 3, transferred to the main face 4a of the support structure 4, and a third electronic structure 3 transferred to the first electronic structure 3. According to this configuration, the encapsulation coating 2 then covers the main face 4a and the electronic structures 3.

However, an encapsulation process for an electronic device 1 such as described previously is not satisfactory.

Indeed, access to the main face 4a and/or to the electronic structure 3, for example to establish an electrical contact, may require an etching step, known as deep etching, to form trenches or VIA 5 in the encapsulation coating 2. However, such an encapsulation coating 2, whenever it is employed as a protection against both chemical and mechanical aggression, is relatively resistant to the known etching processes, resulting in the latter being both lengthy and costly.

Furthermore, deep etching also involves the use of a barrier coating, for example a metallic coating, which is constraining for the design of the electronic device 1.

One purpose of the present invention is therefore to propose a process for exposing a region of the main face and/or the electronic structure(s) simpler to use than any of the known processes at the existing state of the art.

Another purpose of the present invention is also to propose a process for exposing a region of the main face and/or of the electronic structures avoiding the need to use deep etching.

A further purpose of the present invention is to propose a process for exposing a region of the main face and/or of the electronic structures such as to enable optical coupling and alignment of an optical fibre at the exposed region level.

Yet another purpose of the present invention is to propose a simpler to use manufacturing process for coupling and alignment structures, which is compatible with the known micro-manufacturing processes.

DESCRIPTION OF THE INVENTION

The objectives of the present invention are, at least in part, achieved by a process for exposing at least a region of one face, known as the front face, of an electronic device, the process including the following steps:

a) A step for bonding a cover on the front face, the bonding being undertaken such that the cover forms a closed cavity with the region, preferably hermetically sealed;

b) Formation of an encapsulation coating, of thickness E1, covering the front face and the cover;

c) A step for thinning the encapsulation coating, the step for thinning including the removal of a thickness E2, less than the thickness E1, of the encapsulation coating, the thickness E2 being adapted to form an opening in the cover.

According to one embodiment, the cover includes a base and a side wall, the step for bonding a) being carried out by making contact between the edge of the side wall and the front face.

According to one embodiment, the base of the cover is covered by a barrier layer, the step for thinning being further selective such as to selectively etch the cover in relation to the barrier layer.

According to one embodiment, step c) is followed by a step d) for removing the barrier layer, step d) preferably being a chemical etching step.

According to one embodiment, step b) is carried out in accordance with one of the methods chosen among: bonding with adhesive, bonding by soldering, preferably using a solder consisting of tin, silver and copper, bonding by sintering.

According to one embodiment, the step for thinning c) is carried out by mechanical erosion.

According to one embodiment, step b) is carried out by rolling a sheet of encapsulation material.

According to one embodiment, step b) is carried out by injection/moulding of a resin consisting of encapsulation material.

According to one embodiment, the electronic device includes at least one electronic structure transferred to the main face of a support structure, the encapsulation coating formed at step b) covering the main face and at least one electronic structure.

According to one embodiment, the at least one region includes a first region located on the main face of the support structure.

According to one embodiment, the at least one region includes a second region located on the electronic structure.

According to one embodiment, the at least one electronic structure includes a number of electronic structures of different heights, preferably, step a) includes the transfer of a number of covers to a number of regions located on the electronic structures, the depth of the covers being adjusted such that each one of them is opened, essentially, simultaneously during step c).

According to one embodiment, on completion of the step for thinning the electronic structure is essentially flush with the free surface of the encapsulation coating.

According to one embodiment, the cover is filled with resin.

According to one embodiment, the at least one region includes a grating coupler.

According to one embodiment, the at least one region includes at least one electrical connection.

According to one embodiment, the at least one region includes the sensitive region of an MEMS device or sensor.

The invention is also implemented for the manufacture of coupling and alignment structures for at least one optical fibre in an optical coupling zone of a face, known as the front face, of an optoelectonic device, the process including the following steps:

a) A step for bonding at least one cover to the front face, the cover including a base and a side wall, a first cover among at least one cover (600) covering the optical covering zone;

b) The formation of an encapsulation coating, of thickness E1, covering the front face and the at least one cover;

c) A step for thinning, the step for thinning including the removal of the base of the at least one cover and of a thickness E2, being less than the thickness E1, of the encapsulation coating, the side wall and the at least one cover remaining following the step for thinning forming the coupling and alignment structure.

According to one embodiment, the bonding of the first cover is preceded by the formation or the transfer of a beam shaping optical device in the optical coupling zone.

According to one embodiment, the at least one optical fibre is retained at one of its ends in a ferrule, the said ferrule including an optical output located on a face, known as the ferrule coupling face, the optical output facing the optical coupling zone providing that the alignment between the ferrule and an optical coupling device, located in the coupling zone, is effective.

According to one embodiment, the ferrule includes a passage inside of which the at least one optical fibre is inserted, the passage includes an oblique mirror intended to deviate a radiation, liable to be guided by the at least one optical fibre, towards the optical output.

According to one embodiment, the at least one cover further comprise a second cover, whose side wall, known as the second side wall, forms an internal cavity, known as the second internal cavity, intended to accommodate, by insertion, a lug located on the coupling face and whose peripheral surface exhibits a shape complementary to the shape defined by the second side wall, forming an element of the coupling and alignment structure of the at least one optical fibre.

According to one embodiment, the at least one cover includes a third cover, whose side wall, known as the third side wall, forms an internal cavity, known as the third internal cavity, intended to accommodate, by insertion, a second lug located on the coupling face and whose peripheral surface exhibits a shape complementary to the shape defined by the third side wall, forming an element of the coupling and alignment structure of the at least one optical fibre.

According to one embodiment, the at least one cover includes a number of compartments each intended to be coupled to a different optical fibre among the at least one optical fibre.

According to one embodiment, the wall of the first cover, known as the first wall, is designed to accommodate, by insertion in a first internal cavity defined by the said first wall, an alignment element in projection of the coupling face and exhibiting a peripheral surface whose shape is complementary to the shape defined by the first wall.

According to one embodiment, the base of the at least one cover is covered by a barrier coating, the step for thinning being further selective in order to selectively etch the base relative to the barrier coating.

According to one embodiment, step c) is followed by step d) for removal of the barrier coating, preferably step d) is a wet or a dry etching process.

According to one embodiment, step a) is carried out in accordance with one of the methods chosen among: bonding with a polymer adhesive, bonding by soldering (preferably using a solder consisting of tin, silver and copper), bonding by sintering.

According to one embodiment, the thinning step c) is carried out by mechanical erosion.

According to one embodiment, step b) is carried out by rolling a sheet of encapsulation material, or by injection of an encapsulation resin.

According to one embodiment, the optoelectonic device includes at least one electronic component transferred to a main face on a support structure, the encapsulation coating formed during step b) covering the main face and the at least one optoelectonic structure.

According to one embodiment, the optical coupling zone is located on the main face of the support structure.

According to one embodiment, on completion of the thinning step, the optoelectonic structure is essentially flush with the free surface of the encapsulation coating.

According to one embodiment, the optical coupling zone includes a grating coupler.

BRIEF DESCRIPTION OF THE DRAWINGS

Other characteristics and advantages will appear in the description which follows of the exposure process for a region of a face of an electronic device according to the invention, provided as non limiting examples, in reference to the appended drawings in which:

FIGS. 4a to 4e are a schematic representation, according to a sectional view perpendicular to the front face of the electronic device, for the process in accordance with the present invention incorporating a barrier coating;

FIG. 8 is a schematic representation, according to a sectional view perpendicular to the first face of the substrate, of a cover manufacturing process;

DETAILED DESCRIPTION OF PARTICULAR PRODUCTION MODES

The present invention concerns a process intended to form a through opening in an encapsulation coating covering an electronic device, the through opening exposing to the external environment a region of the front face of the said device.

The process includes in particular the bonding of a cover intended to insulate the said region in a cavity, and, subsequently, to form the encapsulation coating. A partial thinning step of the encapsulation coating, for example by mechanical abrasion (grinding), can then be used to open the cavity formed by the cover, and thus expose the inside of the said cavity.

Thus, FIGS. 3a to 7, show examples of the implementation of the exposure process of a region in accordance with the present invention.

Figure 1:
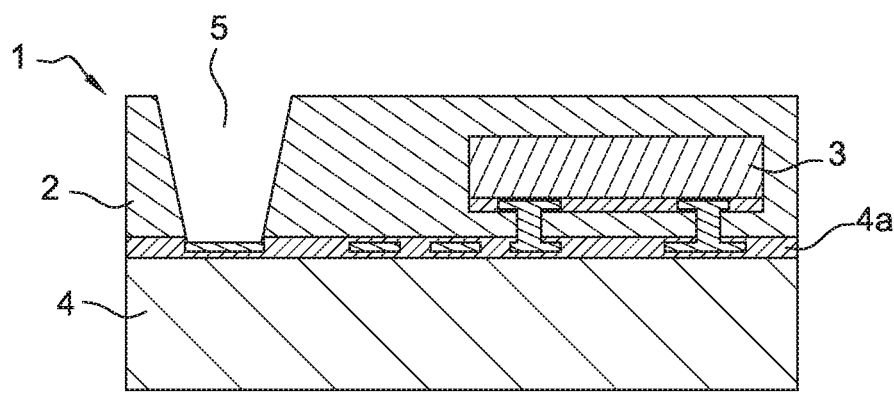
FIG. 1 is a schematic representation of an exposure process for a region of an electronic device covered with an encapsulation coating, in accordance with the state of the art.
Figure 2:
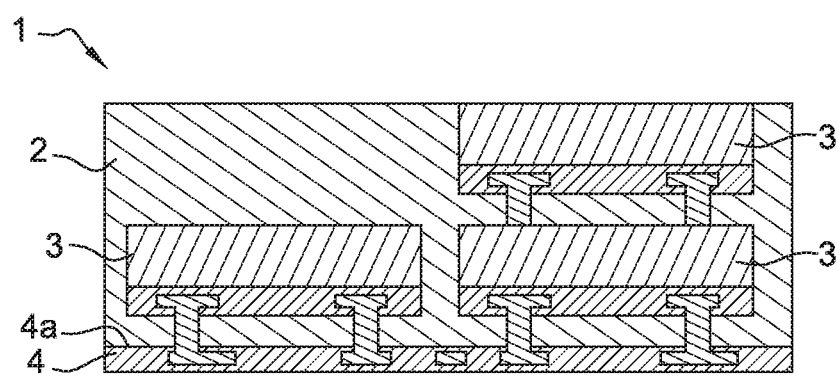
FIG. 2 is a schematic representation of a microelectronic device including a support structure on which electronic structures are transferred, the said electronic device being covered by an encapsulation coating.
Figure 3A:
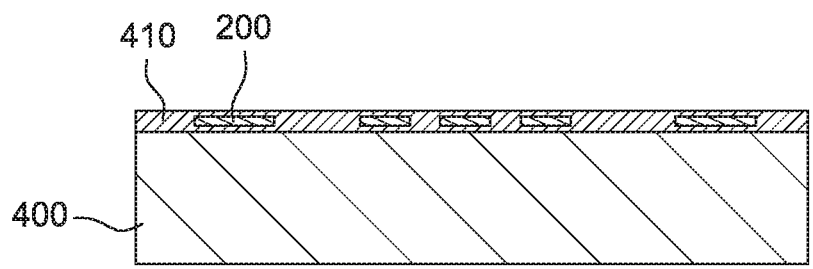
FIGS. 3a to 3d are a schematic representation, according to a sectional view perpendicular to the front face of the electronic device, for the process in accordance with the present invention.
Figure 3B:
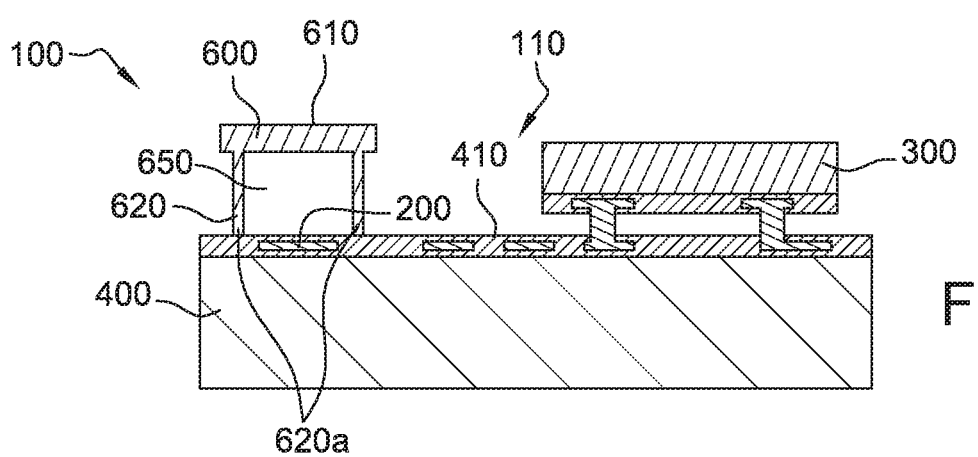
Figure 3C:
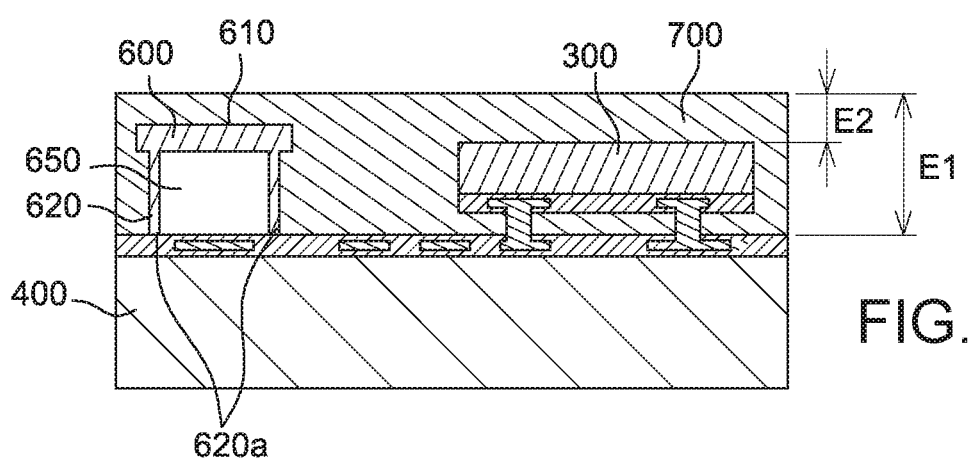
Figure 5A:
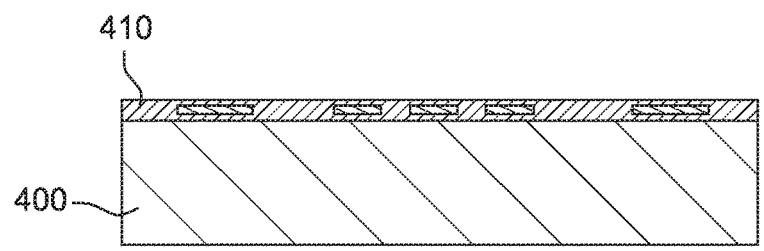
FIGS. 5a to 5e are a schematic representation, according to a sectional view perpendicular to the front face of the electronic device, for the process in accordance with the present invention incorporating a barrier coating and a resin-filled cover.
Figure 5B:
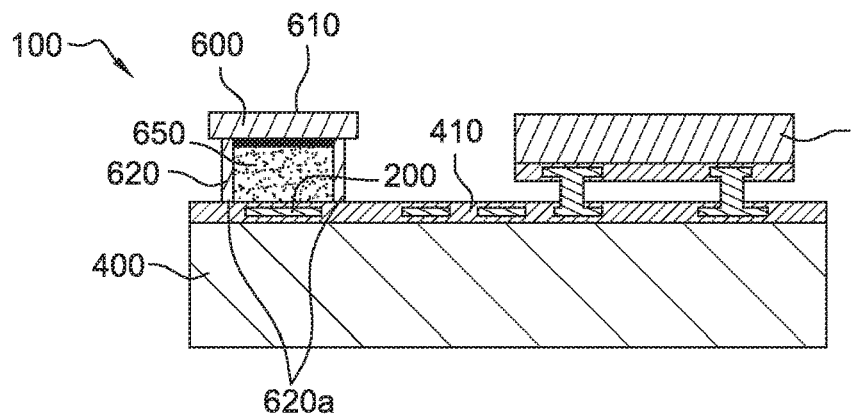
Figure 5C:
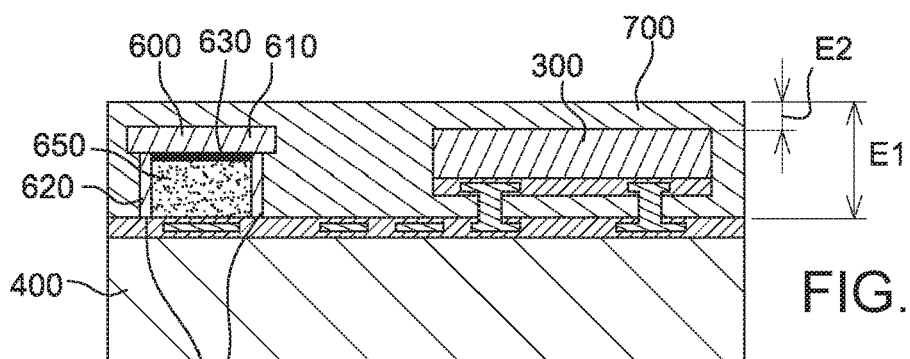

In particular, the process is implemented on an electronic device 100 (FIGS. 3b, 4b, 5b).

The electronic device 100 includes at least one region 200 on its front face 110. A region 200, in accordance with the present invention, corresponds to a region of interest and whose surface area, relative to that of the front face 110, is limited. It is therefore a region of restricted area.

The at least one region 200 may, for example, include at least one electrical connection, and/or one grating coupler, for example an optical grating coupler.

Additionally or as an alternative, the at least one region 200 may include a microelectronic device, of a sensitive region of an MEMS sensor intended to be exposed to the external environment on completion of the exposure process in accordance with the present invention. "Sensitive region of an MEMS sensor", refers to a region intended to be exposed to the external environment and whose function is to collect information from the said environment. Such information may for instance be a temperature or a pressure.

The at least one region 200 may be of any shape. It may in particular be square, rectangular, or circular. The at least one region 200 may also have dimensions ranging from 40 µm to 2 mm.

Moreover, the electrical device 100 may include at least one electronic structure 300 (FIG. 3b, 4b, 5b, 6a) transferred to a support structure 400.

In particular, the at least one electronic structure 300 may be transferred to a main face 410 on the support structure 400.

It is understood that the front face 110 of such a device corresponds to the main face 410 and the exposed surface of the electronic structure 300 after transfer of the said structure 300.

The at least one electronic structure 300 may be transferred through a bonding step, for example, using an individual positioning method of the said at least one electronic structure 300 on the main face 410 (Pick and Place).

In that respect, a supporting substrate may include a number of support structures 400 located in a matrix, on each of which at least one electronic structure 300 is transferred.

The support substrate may include a semi-conductor material, for example silicon, on which the support structures 400 are manufactured.

The support structures 400 may be interposers, or include interconnection circuits intended to provide electrical interconnectivity with the at least one electronic structure 300.

Figure 6A:
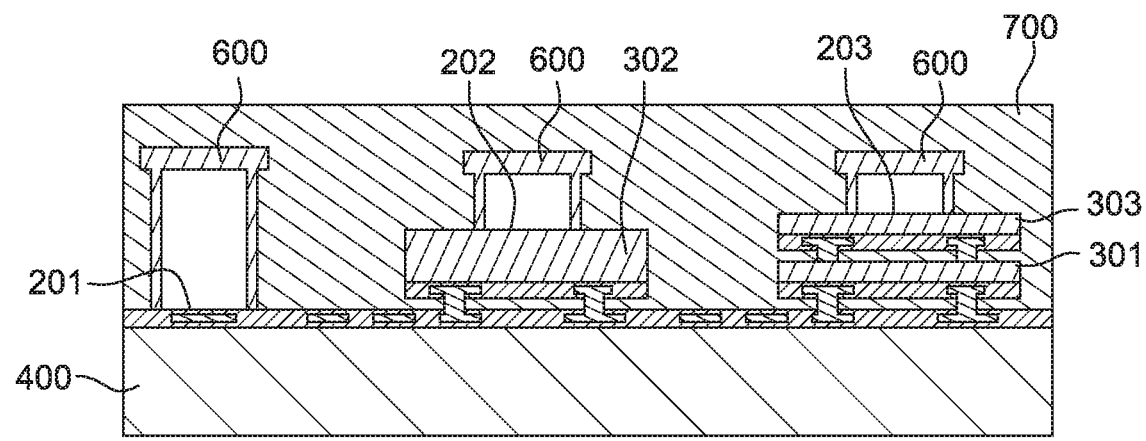
FIGS. 6a to 6b are a schematic representation, according to a sectional view perpendicular to the front face of the electronic device, for the process in accordance with the present invention involving a number of electronic structures.

In particular, a support structure 400 may provide interconnectivity within a given electronic structure 300 and/or between several electronic structures 300 transferred to the main face 410 of the said support structure 400 (FIG. 6a).

Figure 6B:
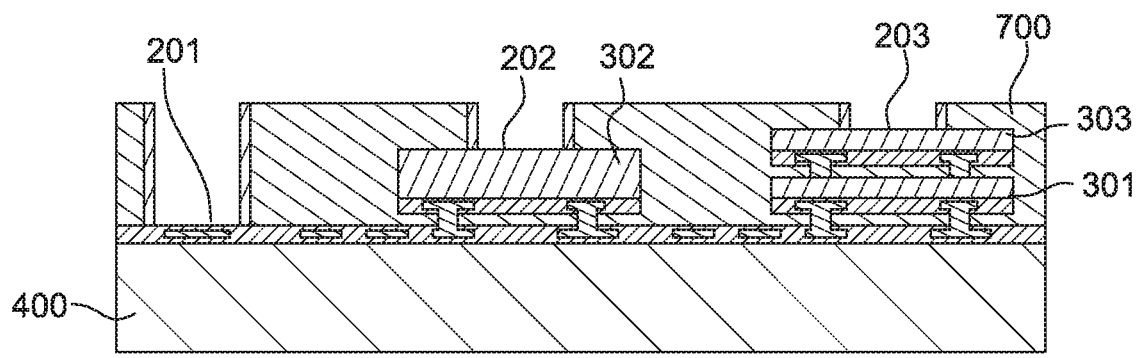

The electronic device 100 may include a single electronic structure 300 (FIGS. 3b, 4b, 5b), or alternatively, several electronic structures 300 (FIGS. 6a and 6b). Whenever several electronic structures 300 are considered, the latter may be of different heights.

For example, and referring to FIG. 6a, the electronic device 100 may include two electronic structures 300 known, respectively, as the first electronic structure 301 and second electronic structure 302 transferred to the main face 410, and another electronic structure 300, known as the third electronic structure 303 transferred to the first electronic structure 301.

The first 301, second 302 and third 303 electronic structures may be of different heights.

The "height of an electronic structure", refers to its dimension in a direction perpendicular to the surface on which it is transferred.

The at least one region 200 may be located on the main face 410 and/or on the at least one electronic structure 300.

In particular, the electronic device 100 may include several regions 200. For example, and referring to FIGS. 6a and 6b, the device may include a region 200, known as the first region 201, located on the main face 410, and another region 200, known as the second region 202, located on the surface exposed to the second electronic structure 302.

The process under which the present invention thus includes step a) for bonding a cover 600 to the front face 110.

The term "cover" refers to a part or element including an open internal cavity and which, when it is positioned on a surface, forms a closed cavity with the said surface.

According to the present invention, the cover 600 is positioned such as to form a closed cavity 650 with the first region (FIGS. 3b, 4b, 5b), preferably a hermetically sealed cavity. In other terms, all the electronic and/or optical functions formed on the region 200 are located in the cavity 650 on completion of step a).

Moreover, it is understood that wherever the electronic device 100 is associated with several regions 200, step a) includes the bonding of several covers 600.

Step a) may be completed by individual placement of covers 600.

The cover 600 may include a base 610 and a side wall 620 (FIGS. 3b, 3c, 4b, 4c, 5b, 5c).

The thickness of the side wall 620 may be between 50 μm and 200 μm, for example 100 μm.

The thickness of the base 610 may be between 50 μm and 200 μm, for example 100 μm.

The cover 600 may be obtained using micro manufacturing techniques which involve a photolithographic step, an etching step (for example dry etching), and a step for individual separation of the covers (singulation).

For example, FIG. 8 illustrates the different steps in the manufacturing process for covers.

The said process includes the supply of a substrate 1000, for example a silicon substrate whose face, known as the first face 1100, is covered with a coating of silicon oxide 1200. The silicon oxide coating may for example be obtained by thermal oxidation of the substrate 1000.

This step is followed by the definition of the patterns 1600 on the covers 600 by a photo lithographic process on the silicon oxide coating.

A dry etching step for the patterns 1600 then reveals the internal cavity 1601 of the covers 600.

An individual separation step for the covers 600 is performed finally.

It is understood that this manufacturing process for the covers 600 is provided as an example only.

The bonding of covers 600 may be achieved by mating the edge 620a of the side wall 620 with the front face 110.

It is understood that on completion of the bonding step a), the surface of the region 200 is circumscribed within a contour defined by the edge 620a.

Particularly advantageously, the bonding may be made with an adhesive spread over the edge 620a.

Again advantageously, the bonding of cover 600 may be carried out by soldering, for example using a tin, copper and silver-based fusible material on one side and a metal on the other side to ensure proper flow of the fusible material.

Finally, the bonding of cover 600 may also be achieved by sintering.

The exposure process for at least one region 200 also includes a step b) for forming an encapsulation coating 700 of thickness E1 and covering the front face 110 and the cover 600 (FIGS. 3c, 4c, 5c, 6a).

The "coating thickness", refers to its dimension in a direction perpendicular to the surface on which it is applied.

It is understood that whenever the electronic device 100 includes a support structure 400 and an electronic structure 300, the encapsulation coating 700 covers the main face 410 and the exposed surface of the electronic structure 300.

The encapsulation coating 700 may be formed on the electronic device 100 or on the support substrate.

The encapsulation coating 700 may, for example, be formed by a rolling process, preferably under vacuum, on a sheet of moulding material.

The term "under vacuum", refers to an atmospheric pressure of less than 10 mbar.

The moulding material is chosen to ensure the mechanical strength of the electronic device 100, but also to provide protection from the environmental conditions to which it is exposed.

In that respect, the moulding material may include either epoxy-based films or resins with or without silicon particles, or silicone-based films or resins.

The rolling process may include a temperature rise, for example by heating a temperature ranging from 60° C. to 200° C., in order to soften the moulding material, and to allow it to fill any interstices which may be present on the front face 110. Thickness E1 may be in the 50 μm to 400 μm thickness range, for example 200 μm.

Figure 3D:
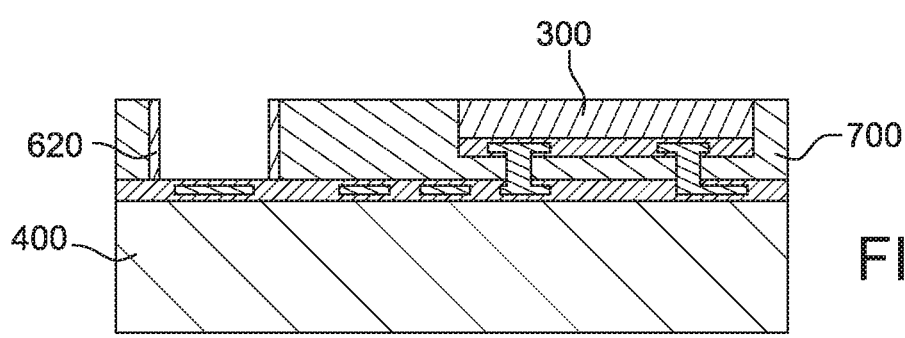
Figure 5D:
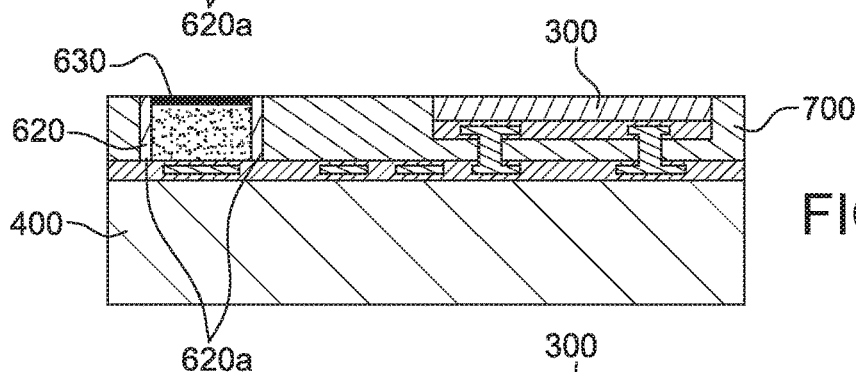
Figure 5E:
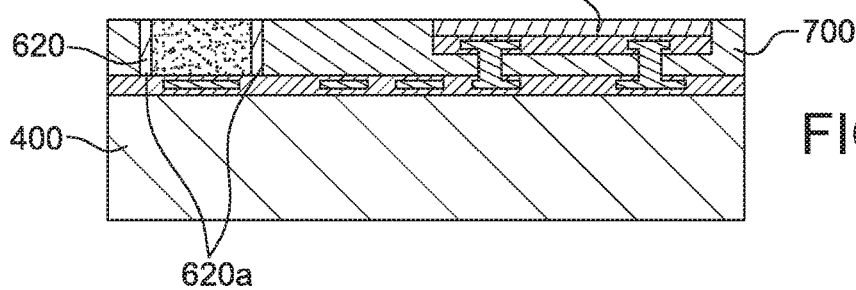

The process according to the invention also includes a thinning step c) (FIGS. 3d, 4d, 5d). The thinning step includes the removal of a thickness E2 (FIGS. 3c, 4c, 5c) from the encapsulation coating 700, the removal thickness E2 being less than thickness E1.

The removed thickness E2, according to the present invention, is however sufficient to form an opening in the cover 600.

In other terms, during the thinning step c), part of the cover 600 is also removed, in order to provide access to part of the internal cavity of the said cover 600. Thus step c) generates the removal of the base 610, leaving only the side wall 620.

Particularly advantageously, the thinning step may be carried out by mechanical erosion.

Additionally, the base 610 of the cover 600 may include a barrier layer 630, for example a layer of silicon oxide (FIGS. 4b-4d, 5c and 5d), at which level step c) is arrested. The barrier layer 630 may also include a resin which fills the cavity 650 at least partially.

It is understood that the barrier layer is located in the internal cavity of the cover 600.

Advantageously, and in the presence of the barrier layer 630, thinning step c) may be selective and preferentially remove the cover relative to the barrier layer 630.

Under such conditions, step c) may be followed by etching step d), advantageously by wet etching, of the barrier layer. For example, in the case of a barrier layer 630 consisting of silica, the wet etching may include the action of a solution of hydrofluoric acid. In the case of a barrier layer 630 consisting of resin, the etching of the said barrier layer 630 may be achieved dry, advantageously by dry etching, even more advantageously by dry etching using a plasma for example an oxygen plasma.

Use of the barrier layer 630 enables limitation of the particular contamination which may occur during thinning step c).

Again advantageously, on completion of step c), the electronic structure 300 may be essentially flush with the encapsulation coating 700 (FIGS. 3d, 4d, 5d).

Alternatively, different covers 600 may be bonded to the main face 410 and to the electronic structures 301, 303 (FIGS. 6a and 6b). According to this configuration, the different covers may be of different depths such as to be opened simultaneously during step c). It is understood that the base 610 of the covers may be covered by the barrier layer 630.

The use of several covers 600, each of different depth, is advantageously used in the event of several electronic structures 300 of different heights being transferred to the support structure 400.

In particular, whenever exposure is required on each of the said different height electronic structures 300 in a region 200, it is possible to adjust the depth of each of the covers 600 considered such that they are all opened simultaneously during step c) (FIGS. 6a and 6b).

This approach is particularly advantageous for sensors or Microsystems which require a limited number of external connections.

Thus, the invention, as presented, provides access for example to the test zones of optical devices, or for establishing wired connections (Wire Bonding).

Figure 7:
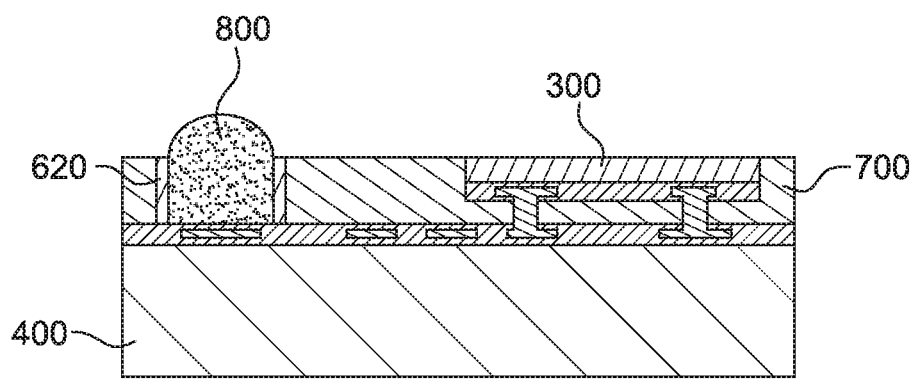
FIG. 7 is a schematic representation, according to a sectional view perpendicular to the front face of the electronic device, the said device being obtainable through the present invention and further comprises serigraphy step intended to fill the internal cavity of the cover with a conducting material after step c)

In relation to FIG. 7, a step e) for establishing the contact 800 in the exposed region 300 may be carried out. Step e) may then be conducted by serigraphy.

Advantageously, and in relation to FIGS. 5a to 5e, the internal cavity of the cover may be filled with resin, for example a resin exhibiting adequate transparency to enable optical coupling between the region 200 and an optical device, via for example an optical fibre.

The process in accordance with the present invention may advantageously be used for the coupling and alignment of at least one optical fibre to the optical coupling zone of the at least one region. In particular, the side wall of the at least one cover on completion of thinning step c) forms a coupling and alignment structure intended to enable optical coupling between the at least one optical fibre and the optoelectonic device. In particular, the side wall forms a light path. The optical fibres may be retained within a ferrule which features alignment structures intended to correspond with the coupling and alignment structure of the optoelectonic device.

Thus, FIGS. 9a to 9e, show examples of the use of the exposure process in the manufacture of coupling and alignment structures.

This process essentially consists of steps a), b) and c) already described.

Figure 9A:
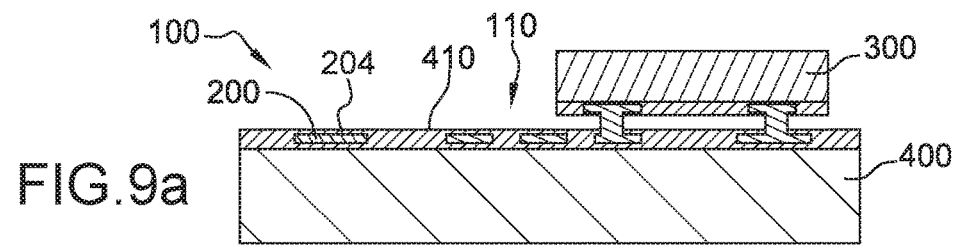
FIGS. 9a to 9e are schematic representations, according to a sectional view perpendicular to the front face of the electronic device, of the implementation of the exposure process for the manufacture of coupling and alignment structures for at least one optical fibre with an optoelectonic device in accordance with the present invention.
Figure 9B:
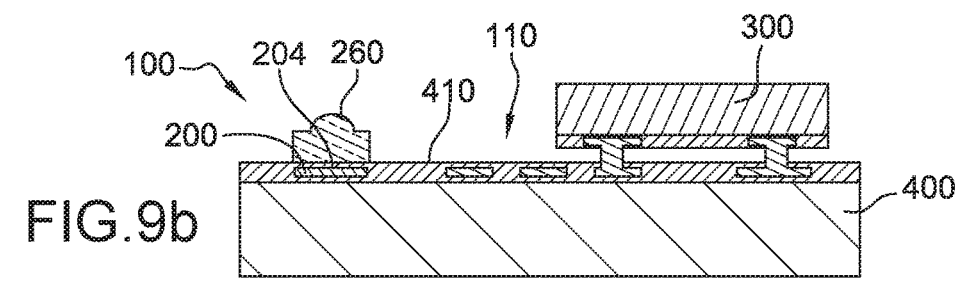

The at least one region 200 includes an optical coupling zone 204 (FIGS. 9a and 9b).

The optical coupling zone 204 includes an optical coupling element, which is for example, and without limitation, a grating coupling. The said optical coupling element operates in transmission and/or reception. An optical coupling zone, in accordance with the present invention, corresponds to a region of interest whose surface area is limited relative to that of the front face 110. It is therefore a limited area region.

Advantageously, the optical coupling zone 204 may include a grating coupler.

The optical coupling zone 204 may be of any shape. It may in particular be square, rectangular, or even circular. The at least one optical coupling zone may be of dimensions ranging from 1 μm to 2 mm, advantageously ranging from 20 μm to 2 mm.

The optical coupling element may be of any shape which permits its light coupling function. The optical coupling element may also be of dimensions ranging from 1 μm to 200 μm, advantageously ranging from 10 μm to 100 μm.

Furthermore, the optoelectonic device 100 may include the at least one electronic structure 300 (FIGS. 9a to 9e) transferred to the support structure 400. As described previously, the at least one electronic structure 300 may be transferred to the main face 410 (FIGS. 9a and 9b) of the support structure 400.

The transfer techniques are familiar to the skilled in the art and may in particular include a soldering, bonding or welding step for example.

In that respect, a support substrate may include several support structures 400 laid for example as a rectangular paving, and on each of which the at least one electronic structure 300 is transferred individually.

The support substrate may include a semi-conductor material, for example silicon, on which the support structures 400 are manufactured or transferred.

The support structures 400 may be interposers, or include interconnection circuits intended to ensure electrical and/or optical interconnectivity with the at least one electronic structure 300.

A support structure 400 may provide the interconnectivity within a given electronic structure 300 and/or between several electronic structures 300 transferred to the main face 410 of the said support structure 400.

The optoelectronic device 100 may include a single electronic structure 300, or alternatively, several electronic structures 300.

The optical coupling zone 204 may be located on the main face 410 and/or on the at least one electronic structure 300.

Figure 9C:
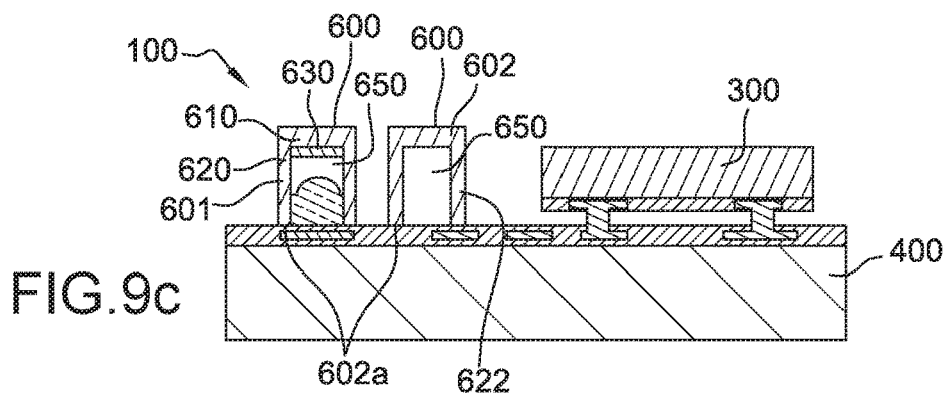

The bonding step a) of the at least one cover 600 to the front face 110 is illustrated in FIG. 9c. In particular, a first cover 601 among the at least one cover is bonded covering the optical coupling zone 204.

The at least one cover 600 is then positioned such as to form a closed cavity 650, with the region on which it is bonded, (FIG. 9c), and advantageously a hermetically sealed cavity. In other terms, all the electronic and/or optical functions, located in the optical coupling zone, are protected within the cavity 650 on completion of step a).

Step a) may be achieved by the individual placement of covers 600, with a positioning accuracy of 5 μm to 10 μm.

The at least one cover 600 may include a base 610 and a side wall 620 (FIG. 9c).

The thickness of the side wall 620 may be in the 50 μm to 200 μm thickness range, for example 100 μm.

The thickness of the base 610 may be in the 50 μm to 200 μm thickness range, for example 100 μm.

The bonding of the at least one cover 600 may be carried out by mating the edge 620a of the side wall 620 with the front face 110.

It is understood that on completion of the bonding step a), the surface of the optical coupling zone 204 is circumscribed within a contour defined by the edge 620a of the first cover 601.

Advantageously, the bonding may be carried out using an adhesive spread over the edge 620a.

Again advantageously, the bonding of the at least one cover 600 may be carried out by soldering, for example soldering using a tin, copper and silver-based fusible material on one side and a metal on the other side to ensure proper flow of the fusible material.

Finally, bonding of the cover 600 may also be carried out by sintering.

Bonding step a) of the at least one cover 600 may be preceded by a step for the manufacture or transfer of a beam shaping optical device 260 on the optical coupling zone 200 (FIG. 9b). This beam shaping optical device 260 may be a collimating lens, and is intended to widen the light beam susceptible to be transmitted or received at the optical coupling zone 204. In particular, the focal plane of the collimating lens may be at the optical coupling zone 204. The optical collimator 260 may be formed directly on the optical coupling zone by a photo lithographic process or by transfer of a pre-formed lens. It may include several elements (for example a matrix of micro lenses) intended to shape several beams.

Figure 9D:
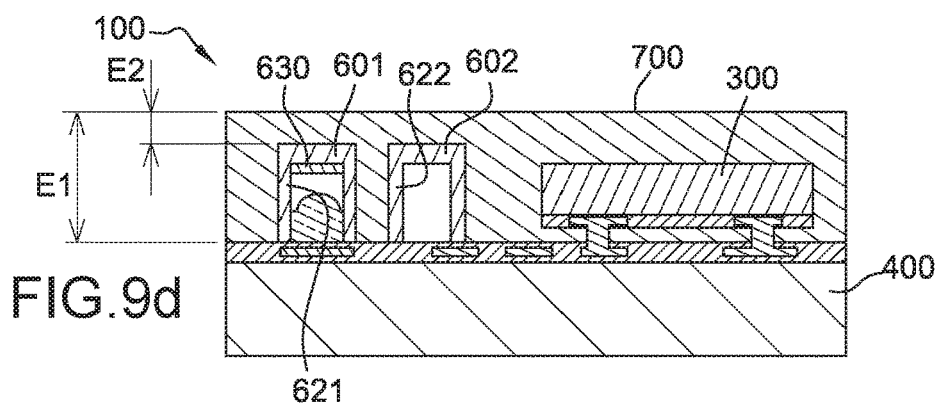

Step b) for forming an encapsulation coating 700 of thickness E1 and covering the front face 110 and the at least one cover 600 is illustrated in FIG. 9d.

It is understood that if the optoelectronic device 100 includes a support structure 400 and an electronic structure 300, the encapsulation coating 700 covers the main face 410 and the exposed surface of the electronic structure 300.

The encapsulation coating 700 may be formed at the optoelectronic device 100 or at the support substrate.

The encapsulation coating 700 may, for example, be formed by a rolling process, advantageously under vacuum, of a sheet of moulding material.

The moulding material is chosen to provide the mechanical strength of the optoelectronic device 100, but also to provide protection from the environmental conditions to which it is exposed.

In that respect, the moulding material may include either epoxy-based resins or films with or without silicon particles, or silicone-based resins or films.

The rolling process may include heating, for example to between 60° C. and 200° C., in order to soften the moulding material, and such that the latter perfectly fills any interstices which may be present on the front face 110.

Thickness E1 may be between 5 µm and 2 mm, for example 200 µm.

Figure 9E:
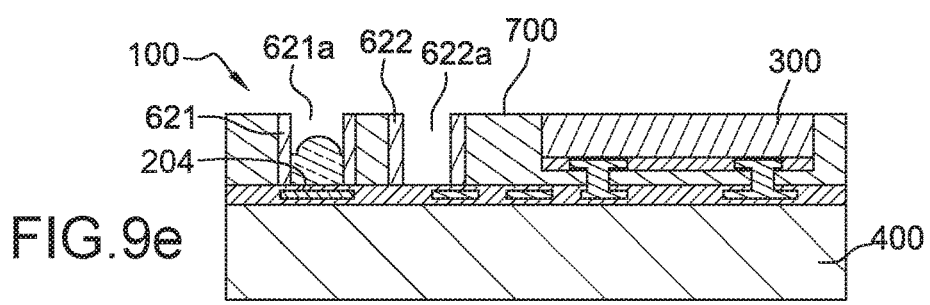

The thinning step c) is illustrated in FIG. 9e. The thinning step includes removal from the base 610 of the at least one cover 600 and a thickness E2, which is less than E1, of the encapsulation coating, the side wall 610 from the at least one cover 600 remaining on completion of the thinning step forming the coupling and alignment structure (FIGS. 9d and 9e) and a light path.

It is understood that the thinning step enables the removal, in a single step, of a thickness E2 of the encapsulation coating and of the base 610 of the at least one cover 600.

Particularly advantageously, the thinning step may be achieved by mechanical erosion (grinding).

Moreover, the base 610 of the cover 600 may include a barrier layer 630 (FIGS. 9c and 9d), for example a coat of silicon oxide, which arrests step c).

It is understood that the barrier layer 630 may be located in the internal cavity of the cover 600.

Advantageously, and in the presence of the barrier layer 630, thinning step c) may be selective and preferentially remove the base of the cover relative to the barrier layer 630.

Under such conditions, step c) may be followed by an etching step d), advantageously humid etching, of the barrier layer. For example, in the case of a silica barrier layer 630, the humid etching may include the action of a solution of hydrofluoric acid.

Step d) may, alternatively, include dry etching, for example etching using a plasma.

Use of the barrier layer 630 enables limitation of the particular contamination of the internal cavity which could occur during thinning step c) in the absence of this layer.

Again advantageously, on completion of step c), the electronic structure 300 may be essentially flush with the encapsulation coating 700 (FIG. 9e).

The coupling and alignment structure 204 formed on the device 400 according to the present invention is thus arranged such as to allow optical coupling and alignment of at least one optical fibre 800 with the optical coupling element. In particular, the at least one optical fibre 800 retained in a ferrule 500, which ferrule 500 corresponds with the coupling and alignment structure manufactured on the device 400.

Figure 10A:
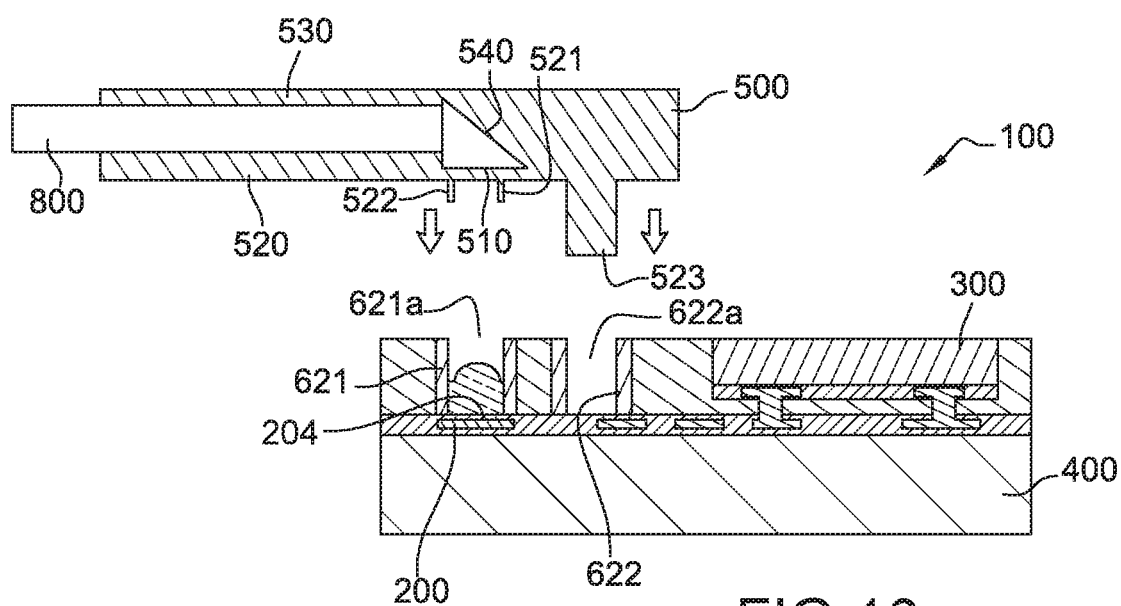
FIGS. 10a and 10b are schematic representations, in accordance with a sectional view perpendicular to the front face of the electronic device, for the coupling of an optical fibre with an optical coupling zone, in accordance with the present invention.
Figure 10B:
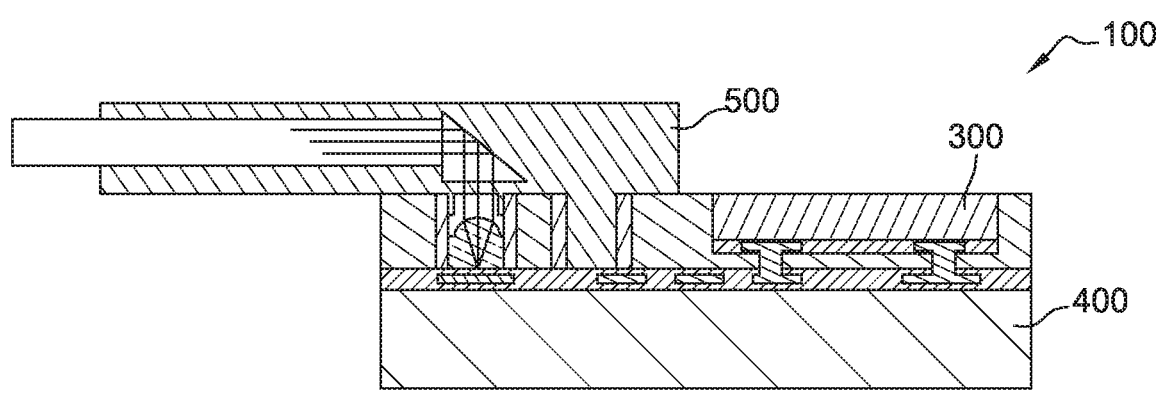

The ferrule 500 may include an optical output 510 located on a face, known as the coupling face 520 of the ferrule and which is positioned facing the optical coupling element such that the coupling is effective (FIG. 10b).

The ferrule 500, by definition, includes a passage 530 inside of which the at least one optical fibre 800 is inserted. Additionally, the ferrule 500 may also include an optical device, for example an oblique mirror 540 facing one end of the at least one optical fibre 800 and intended to deviate the light beam emitted from the said end towards the optical output 510 (This mirror may be curved, such as to form a collimated light beam at the ferrule coupling face output).

In a first example of use illustrated in FIGS. 9e, 10a and 10b, the side wall 621 of the first cover 601 (FIG. 10d), known as the first wall 621, forms a first internal cavity 621a acting as a light path.

The shape of the first wall 621 may be square, rectangular or circular. The first internal cavity 621a may be compartmented, for example by internal walls (in other terms, several light paths are formed).

Still according to this first example of use, the at least one cover 600 may also include a second cover 602 (FIG. 9d) whose side wall 622, known as the second wall 622, forms an internal cavity known as the second internal cavity 622a.

The second internal cavity 622a may be located to accommodate, by insertion, a lug 523 located on the coupling face 520. Advantageously, the lug 523 exhibits a shape complementary to the second internal capacity 622a. Advantageously, the dimensions of the lug 523 and the side wall 622 may be adjusted to ensure a passive mechanical positioning tolerance better than 10 µm.

Additionally or alternatively, the first internal cavity 621a may be arranged to accommodate, by insertion, an alignment element 521 formed in projection on the coupling face 520. Particularly advantageously, the alignment element 521 includes a first peripheral surface 522.

In particular, the first peripheral surface 522 may be of a shape complementary to the shape defined by the first wall 621.

According to a second example of use, complementary to the first example, the at least one cover 600 may include a third cover (not shown in the Figures) of which the side wall, known as the third wall, forms an internal cavity known as the third internal cavity.

The third internal cavity may be arranged to accommodate, by insertion, a second lug located on the coupling face 520. Advantageously, the shape of the second lug is complementary to that of the third internal cavity. It is understood that the second lug (not shown in the Figures) is similar in shape to the lug 523.

In accordance with the present invention, the coupling and alignment structures are formed integrated, and their manufacture involves only steps which are compatible with known micro manufacturing techniques.

The opening of the covers and thinning of the chips 300 is achieved in a single step.

Additionally, the cost of the present process is also compatible with the requirements of the microelectronics, MEMS, and optoelectonic device industries.

The invention claimed is:

1. An exposure process for at least one region (200) of a face, known as the front face (110), an electronic device (100), the process including the following steps:
   a) A step for bonding for at least one cover (600) on the front face (110), the bonding being carried out such that the cover (600) forms a closed cavity (650) with the region (200), advantageously hermetically sealed;
   b) Formation of an encapsulation coating (700), of thickness E1, covering the front face (110) and the at least one cover (600);
   c) A step for thinning for the encapsulation coating (700), the thinning step including removal of a thickness E2, which is less than thickness E1, of the encapsulation coating (700), the removal thickness E2 being adapted such that an opening is formed in the cover (600).

2. Process according to claim 1, in which the cover (600) includes a base (610) and a side wall (620), the bonding step a) being achieved by mating an edge of the side wall (620) with the front face (110).

3. Process according to claim 2, in which the base (610) of the cover (600) is covered by a barrier layer (630), the thinning step additionally being selective to ensure selective etching of the cover (600) relative to the barrier layer (630).

4. Process according to claim 3, in which step c) is followed by a step d) for removing the barrier layer (630), advantageously step d) is a chemical or dry etching step.

5. Process according to claim 1, in which step a) is carried out in accordance with one of the methods chosen among: bonding with adhesive, advantageously a polymer adhesive, bonding by welding or soldering advantageously using a tin, copper and silver-based fusible material, bonding by sintering.

6. Process according to claim 1, in which the thinning step c) is carried out by mechanical erosion.

7. Process according to claim 1, in which step b) is achieved by rolling a sheet of encapsulation material, or by injection of a resin consisting of encapsulation material.

8. Process according to claim 1, in which the at least one region (200) includes an optical coupling region (204), and a first cover (601) among the at least one cover (200) configured to form a coupling and alignment structure of at least one optical fibre (800) in the optical coupling region.

9. Process according to claim 8, in which step a) is preceded by the formation or transfer of a beam shaping optical device (260) in the optical coupling zone (204).

10. Process according to claim 8, in which the at least one optical fibre (800) is retained at one of its ends in a ferrule (500), the said ferrule (500) including an optical output (510) located on a face, known as the coupling face (520) of the ferrule, the optical output (510) facing the optical coupling zone (204) providing that the alignment between the ferrule and the optical coupling element (200*a*), located in the coupling zone (204), is effective.

11. Process according to claim 10, in which the ferrule includes a passage (530) inside of which the at least one optical fibre (800) is inserted, the passage (530) featuring an oblique mirror (540) intended to deviate a radiation, susceptible to be guided by the at least one optical fibre (800), towards the optical output (510).

12. Process according to claim 10, in which the wall of the first cover (601), known as the first wall (621), is arranged to accommodate, by insertion in a first internal cavity (621*a*) defined by the said first wall (621), an alignment element (521) in projection of the coupling face (520) and featuring a peripheral surface whose shape is complementary to the shape defined for the first wall (621).

13. Process according to claim 10, in which the at least one cover (600) additionally includes a second cover (602), whose side wall (620), known as the second wall (622), forms an internal cavity, known as the second internal cavity (622*a*), intended to accommodate, by insertion, a lug (523) located on the coupling face (520) and whose peripheral surface is of shape complementary to the shape defined by the second wall (622), forming an element of the coupling and alignment structure of the at least one optical fibre.

14. Process according to claim 13, in which the at least one cover (600) includes a third cover, whose side wall (620), known as the third wall, forms an internal cavity, known as the third internal cavity, intended to accommodate, by insertion, a second lug located on the coupling face (520) and whose peripheral surface is of a shape complementary to the shape defined by the third wall, forming an element of the coupling and alignment structure of the at least one optical fibre.

15. Process according to claim 1, in which the electronic device (100) includes at least one electronic structure (300) transferred to a main face (410) of a support structure (400), the encapsulation coating (700) formed at step b) covering the main face (410) and the at least one electronic structure (300), advantageously the at least one region (200) includes a first region (201) located on the main face (410) of the support structure (400).

16. Process according to claim 15, in which the at least one region (200) includes a second region (202) located on the electronic structure (300).

17. Process according to claim 1, in which the at least one electronic structure (300) includes a number of electronic structures (302, 303) of different heights, advantageously, step a) includes the transfer of a number of covers (600) on a number of regions (202, 203) located on the electronic structures (302, 303), the depth of the covers (600) being adjusted such that they are all opened, essentially, simultaneously during step c).

18. Process according to claim 16, in which on completion of the thinning step the electronic structure (300) is essentially flush with the free surface of the encapsulation coating (700).

19. Process according to claim 1, in which the at least one region (200) includes at least one electrical connection or an MEMS sensor sensitive region.

* * * * *